(12) United States Patent
Rahimo et al.

(10) Patent No.: US 8,450,777 B2
(45) Date of Patent: May 28, 2013

(54) METHOD FOR MANUFACTURING A REVERSE-CONDUCTING INSULATED GATE BIPOLAR TRANSISTOR

(75) Inventors: Munaf Rahimo, Uezwil (CH); Jan Vobecky, Lenzburg (CH); Arnost Kopta, Zurich (CH)

(73) Assignee: ABB Technology AG, Zürich (CH)

( * ) Notice: Subject to any disclaimer, the term of this patent is extended or adjusted under 35 U.S.C. 154(b) by 185 days.

(21) Appl. No.: 12/778,751

(22) Filed: May 12, 2010

(65) Prior Publication Data

US 2010/0270585 A1    Oct. 28, 2010

Related U.S. Application Data

(63) Continuation of application No. PCT/EP2008/065030, filed on Nov. 6, 2008.

(30) Foreign Application Priority Data

Nov. 14, 2007   (EP) ..................... 07120665

(51) Int. Cl.
    *H01L 29/66*   (2006.01)
(52) U.S. Cl.
    USPC ............ 257/197; 257/E29.066; 257/E29.197; 257/E21.382
(58) Field of Classification Search
    USPC ................. 257/590, 197, E29.201, E29.107, 257/E29.037; 438/133
    See application file for complete search history.

(56) References Cited

U.S. PATENT DOCUMENTS

| | | |
|---|---|---|
| 4,587,713 A | 5/1986 | Goodman et al. |
| 5,070,377 A | 12/1991 | Harada |
| 2005/0017290 A1 | 1/2005 | Takahashi et al. |
| 2005/0258493 A1 | 11/2005 | Aono et al. |
| 2007/0080407 A1 | 4/2007 | Kono |
| 2007/0231973 A1 * | 10/2007 | Ruething et al. .............. 438/133 |

FOREIGN PATENT DOCUMENTS

| | | |
|---|---|---|
| DE | 10261424 B3 | 7/2004 |
| GB | 2241111 A1 | 8/1991 |
| JP | 2007-103770 A | 4/2007 |

OTHER PUBLICATIONS

International Search Report for PCT/EP2008/065030 completed Feb. 12, 2009.
Written Opinion for PCT/EP2008/065030 completed Feb. 12, 2009.
European Search Report completed Jul. 9, 2008.
Notification Concerning Transmittal of International Preliminary Report on Patentability (Forms PCT/IB/326 and PCT/IB/373) and the Written Opinion of the International Searching Authority (Form PCT/ISA/237) issued in corresponding International Application No. PCT/EP2008/065030 dated May 27, 2010.

* cited by examiner

*Primary Examiner* — Jarrett Stark
(74) *Attorney, Agent, or Firm* — Buchanan Ingersoll & Rooney PC (57) ABSTRACT

A reverse-conducting insulated gate bipolar transistor includes a wafer of first conductivity type with a second layer of a second conductivity type and a third layer of the first conductivity type. A fifth electrically insulating layer partially covers these layers. An electrically conductive fourth layer is electrically insulated from the wafer by the fifth layer. The third through the fifth layers form a first opening above the second layer. A sixth layer of the second conductivity type and a seventh layer of the first conductivity type are arranged alternately in a plane on a second side of the wafer. A ninth layer is formed by implantation of ions through the first opening using the fourth and fifth layers as a first mask.

12 Claims, 9 Drawing Sheets

METHOD FOR MANUFACTURING A REVERSE-CONDUCTING INSULATED GATE BIPOLAR TRANSISTOR

RELATED APPLICATIONS

This application claims priority as a continuation application under 35 U.S.C. §120 to PCT/EP2008/065030, which was filed as an International Application on Nov. 6, 2008 designating the U.S., and which claims priority to European Application 07120665.0 filed in Europe on Nov. 14, 2007. The entire contents of these applications are hereby incorporated by reference in their entireties.

FIELD

The present disclosure relates to the field of power electronics. More particularly, the present disclosure relates to a reverse-conducting insulated gate bipolar transistor (RC-IGBT), and to a method for manufacturing an RC-IGBT.

BACKGROUND INFORMATION

Figure 1:
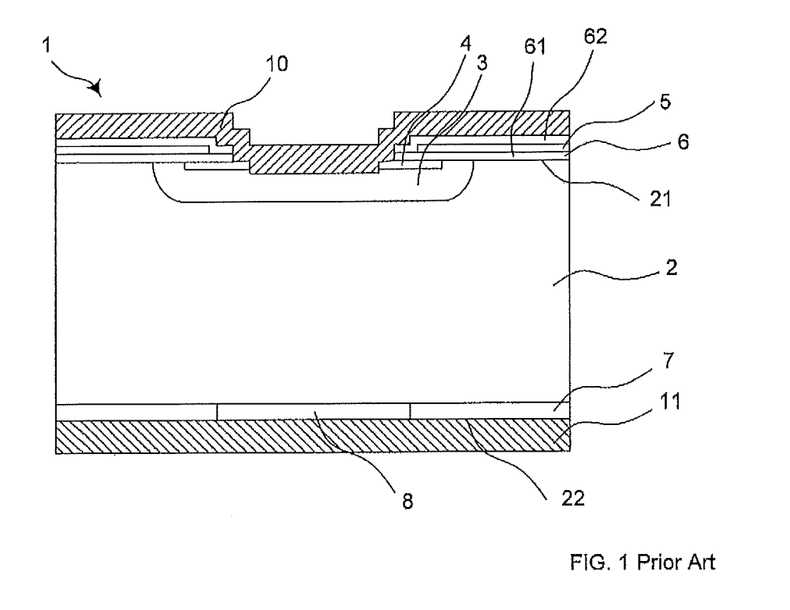
FIG. 1 shows a cross sectional view of a prior art reverse-conducting IGBT.

US 2005/0017290 discloses an RC-IGBT, which includes, within one wafer, an insulated gate bipolar transistor (IGBT) with a built-in freewheeling diode. As shown in FIG. 1, such RC-IGBT 1 includes a first layer 2 formed as an n-type base layer with a first main side 21 and a second main side 22 opposite the first main side 21. A second p-type layer 3 is arranged on the first main side 21. On the second layer 3, a third n-type layer 4 with a higher doping than the first layer 2 is arranged on the first main side 21. The third layer 4 is surrounded by the second layer 3 in such a way that in the central part of the second layer 3, no portion of the third layer 4 is arranged above the second layer 3.

A fifth electrically insulating layer 6 is arranged on the first main side 21. The fifth layer 6 covers the second layer 3 and the first layer 2, and partially covers the third layer 4. An electrically conductive fourth layer 5 is completely embedded in the fifth layer 6. No portions of the fourth layer 5 or the fifth layer 6 are arranged above the central part of the second layer 3.

A first electrical contact 10 is arranged on the first main side 21 and covers the fifth layer 6. The first electrical contact 10 is in direct electrical contact with the second layer 3 and the third layer 4, but is electrically insulated from the fourth layer 5.

P-type sixth layers 7 and n-type seventh layers 8 are arranged alternately in a plane on the second main side 22. The seventh layers 8 have a higher doping than the n-type first layer 2. The seventh layers 8 are arranged directly below the second layer 3 and the first electrical contact 10 if seen in an orthographic projection.

A second electrical contact 11 is arranged on the second main side 22. The second electrical contact 11 covers the sixth and seventh layers 7, 8 and is in direct electrical contact with the sixth and seventh layers 7, 8.

In the RC-IGBT 1 illustrated in FIG. 1, a freewheeling diode is formed between the second electrical contact 11, part of which forms a cathode electrode in the diode, the seventh layer 8, which forms a cathode region in the diode, the first layer 2, part of which forms a base layer in the diode, the second layer 3, part of which forms an anode region in the diode, and the first electrical contact 10, which forms an anode in the diode.

An IGBT is formed between the second electrical contact 11, part of which forms a collector electrode in the IGBT, the sixth layer 7, which forms a collector region in the IGBT, the first layer 2, part of which forms a base layer, the second layer 3, part of which forms a p-base region in the IGBT, the third layer 4, which forms a source region in the IGBT, and the first electrical contact 10, which forms an emitter electrode. During an on-state of the IGBT, a channel is formed between the emitter electrode, the source region and the p-base region towards the n-base layer.

US 2005/0258493 discloses a similar RC-IGBT, but with a trench gate structure. A recombination layer is formed below the trench gate electrode and the p-base region. The recombination layer extends completely through the first layer in a plane parallel to the first main side, i.e. the recombination layer is formed through the diode section as well as through the IGBT section. This recombination layer is formed by uniform Helium irradiation. By the introduction of this layer, the plasma distribution in the diode section of the RC-IGBT is improved. Within the IGBT section, however, it is not desired to have reduced plasma distribution, because it leads to higher on-state losses.

JP 2007-103770 also discloses an RC-IGBT. The lifetime controlling is improved by introducing local recombination layers, which are arranged in the first layer in the diode section close to the second main side, i.e. in the area in which the second layer is in direct contact with the anode and the cathode layer on the second main side. The defect layer is formed by a complex masking technique, in which a metal mask is introduced on the second side of the wafer after the finishing of the device on the first side (emitter side in the finalized device) and after creating the collector and cathode layer and the second electrical contact. The mask has openings in the diode section, i.e. in the area in which the cathode layer is arranged. The mask has to be aligned to the first electrical contact on the first side of the wafer, i.e. with the side which lies opposite to the side where the mask is positioned. Only by such a positioning can it be ensured that the recombination fields will be arranged in the diode section of the reverse-conducting IGBT in the first base layer between the cathode layer and the anode layer. Then, the wafer is irradiated with a light ion beam. The thickness of the mask and/or energy of the beam are chosen in such a way that the ions only penetrate into the wafer in the diode section, i.e. in the part in which the collector layers are arranged. Afterwards, the mask is removed and the device is completed.

DE 102 61 424 B3 discloses a manufacturing method for an IGBT with a defect layer, which is arranged in the second layer. The defect layer has been manufactured previous to the finalizing of the electrically insulating layer, i.e. the defect layer has been manufactured after manufacturing of that part of the electrically insulating layer, which is located under the electrically conductive fourth layer, and after manufacturing of the electrically conductive fourth layer, but before finalizing the electrically insulating layer, i.e. before manufacturing that part of the insulating layer which covers the electrically conductive fourth layer 5 to the top and to that side, on which the poly opening is located, so that the defect layer extends over the width of the second layer and over the whole width of the third layer formed as a source region. However, for the above described manufacturing or finalizing of the electrically insulating layer, a high temperature step has to be performed, by which undesired activation of the defects is introduced and thus, recombination centers are destroyed. Furthermore, it is difficult to make such a structure with the defect layer extending across the poly opening and under the source regions as disclosed in DE 102 61 424 B3. Such a device can have negative implications on the device safe operating area and on-state performance since it provides a high resistance path under the source regions which normally results in thyristor latch-up and device failure. This device can also negatively influence the MOS channel parameters and charge distribution near the IGBT cell.

SUMMARY

An exemplary embodiment of the present disclosure provides a method of manufacturing a reverse-conducting insulated gate bipolar transistor. The exemplary method can include the following steps: forming a first layer of a first conductivity type on a part of a wafer of the first conductivity type having a first side and a second side opposite the first side, the part of the wafer having an unamended doping in the finalized reverse-conducting insulated gate bipolar transistor; creating a second layer of a second conductivity type and at least one third layer of the first conductivity type on the first side, the third layer being surrounded by the second layer; creating a fifth electrically insulating layer on the first side, the created fifth electrically insulating layer partially covering the at least one third layer, the second layer, and the first layer; creating an electrically conductive fourth layer on the first side to be insulated from the wafer by the fifth layer, the at least one third layer, the fourth layer and the fifth layer being created to collectively form a first opening above the second layer; creating a first electrical contact on the first side, the first electrical contact being in direct contact with the second layer and the third layer within the first opening; creating at least one sixth layer of the second conductivity type and at least one seventh layer of the first conductivity type on the second side, the at least one sixth and seventh layers being arranged alternately in a plane; creating a second electrical contact on the second side to be in direct electrical contact with the at least one sixth and seventh layer; and after the creation of the fourth and fifth layers, creating at least one ninth layer, which is formed as a defect layer with defect centers, by implantation of ions on the first side through the first opening, using at least the fourth and fifth layer as a first mask. According to the exemplary method, the defect centers are not activated.

An exemplary embodiment provides an RC-IGBT. The exemplary RC-IGBT includes a first layer of a first conductivity type with a first main side and a second main side opposite the first main side, and a second layer of a second conductivity type arranged on the first main side. The exemplary RC-IGBT also includes at least one third layer of the first conductivity type arranged on the first main side and surrounded by the second layer, and a fifth electrically insulating layer arranged on the first main side and partially covering the at least one third layer. In addition, the exemplary RC-IGBT includes an electrically conductive fourth layer arranged on the first main side and being electrically insulated from the at least one third layer, the fourth layer and the first layer by the fifth layer, where the at least one third layer, the fourth layer and the fifth layer are formed, in such a way that a first opening is arranged above the second layer. The exemplary RC-IGBT also includes a first electrical contact arranged on the first main side in direct electrical contact with the second layer and the third layer within the first opening, and at least one sixth layer of the second conductivity type and at least one seventh layer of the first conductivity type, which are arranged on the second main side, the at least one sixth and seventh layers being arranged alternately in a plane. The exemplary RC-IGBT also includes a second electrical contact arranged on the second main side in direct electrical contact with the at least one sixth layer and the at least one seventh layer. In addition, the exemplary RC-IGBT includes at least one ninth layer constituting a defect layer with defect centers, which do not contribute to doping, where a lateral extension of the at least one ninth layer is limited to an area defined by a border of the first opening within at least one of the second layer and the first layer below the second layer.

BRIEF DESCRIPTION OF THE DRAWINGS

Additional refinements, advantages and features of the present disclosure are described in more detail below with reference to exemplary embodiments illustrated in the drawings, in which.

The reference symbols used in the drawings and their meaning are summarized in the list of reference symbols below. Generally, alike or alike-functioning parts are given the same reference symbols. The embodiments described herein are meant as examples and shall not confine the disclosure.

DETAILED DESCRIPTION

Exemplary embodiments of the present disclosure provide a simplified method of manufacturing a reverse-conducting insulated gate bipolar transistor, which has improved switching characteristics in the diode section without deterioration of the characteristics in the IGBT section.

According to an exemplary embodiment, the method of manufacturing a reverse-conducting insulated gate bipolar transistor can include the following steps:

On a wafer of a first conductivity type with a first side and a second side opposite the first side, a second layer of a second conductivity type and at least one third layer of the first conductivity type, which is surrounded by the second layer, are created on the first side of the wafer. The third layer has a higher doping than the wafer. A part of the wafer, which has an unamended doping in the finalized RC-IGBT, forms a first layer.

Afterwards, a fifth electrically insulating layer is created on the first side, which partially covers the at least one third layer, the second layer and the first layer, i.e. that part of the wafer which has an unamended doping in the finalized device.

An electrically conductive fourth layer is created on the first side, which is electrically insulated from the wafer by the fifth layer. The at least one third layer, the fourth layer and the fifth layer are created in such a way that they form a first opening above the second layer.

A first electrical contact is created on the first side in direct electrical contact with the second layer and the third layer within the first opening.

At least one sixth layer of the second conductivity type and at least one seventh layer of the first conductivity type are created on the second side. The at least one sixth and seventh layers are arranged alternately in a plane. The at least one seventh layer has a higher doping than the first layer.

A second electrical contact is created on the second side in direct electrical contact with the at least one sixth and seventh layer.

After the creation of the fourth and fifth layers, at least one ninth layer, which is formed as a defect layer, is created by implantation of ions on the first side through the first opening using at least the fourth and fifth layer as a first mask.

The reverse-conducting insulated gate bipolar transistor according to exemplary embodiments of the present disclosure includes at least one ninth recombination layer formed as a defect layer, i.e. by which defects centers in the ninth layer are formed. The ninth layer is arranged within the second layer and/or below the second layer in the first layer, and the defect layer is constrained to the area of the first contact opening, i.e. the opening at which the first electrical contact is in electrical contact with the second and third layers. The defects centers are only crystal defects, which do not provide a doping.

According to exemplary embodiments of a method for manufacturing an RC-IGBT, an RC-IGBT is produced in which the plasma distribution in the device is optimized by locally reducing the plasma near the anode electrode of the diode without deteriorating the properties of the IGBT near the anode electrode like the on-state losses.

The exemplary method and RC-IGBT are also advantageous, because the mask is applied on the same side on which the defect layer shall be arranged and to which side the defect layer shall be aligned, thus avoiding the necessity to position a mask on the second side and to align it to the position of the first electrical contact and the second and third layer on the other side, i.e. on the first side. Furthermore, the exemplary method does not need a special mask at all, because the mask can be made of layers, which are part of to the RC-IGBT.

Since the at least one ninth defect layer is arranged close to the first electrical contact, the exemplary RC-IGBT does not need an alignment of the sixth layer, which forms the cathode layer in the diode, and still the advantages of the present disclosure of improving the diode properties without deteriorating the IGBT properties can be maintained. Due to the self-alignment to the first opening, by which the lateral extension of the defect layer is limited to an area defined by the border of the first opening, the at least one ninth defect layer can not be shifted in such a way that it would be located in the IGBT section of the RC-IGBT.

Figure 2:
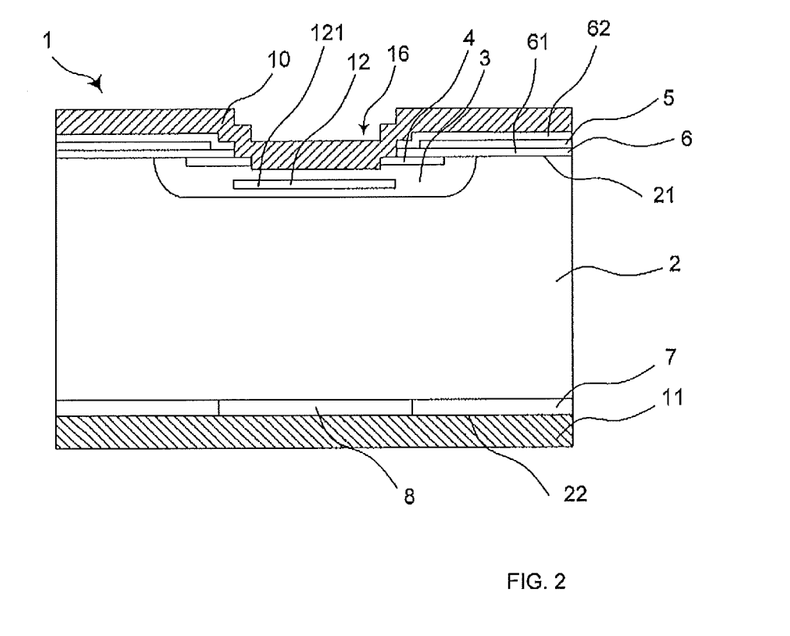
FIG. 2 shows a cross sectional view of an exemplary embodiment of a reverse-conducting IGBT according to the present disclosure.

A first exemplary embodiment of an inventive reverse-conducting insulated gate bipolar transistor (RC-IGBT) 1 is shown in FIG. 2. The RC-IGBT 1 includes an n-type first layer 2 with a first main side 21 and a second main side 22 opposite the first main side 21. A p-type second layer 3 is arranged on the first main side 21. At least one n-type third layer 4 is arranged on the first main side 21 and is surrounded by the second layer 3. The at least one third layer 4 has a higher doping than the first layer 2. A fifth electrically insulating layer 6 is arranged on the first main side 21 on top of the first, second, and third layers 2, 3, 4. The fifth electrically insulating layer 6 at least partially covers the at least one third layer 4, the second layer 3 and the first layer 2. An electrically conductive fourth layer 5 is arranged on the first main side 21 and is electrically insulated from the at least one third layer 4, the second layer 3 and the first layer 2 by the fifth layer 6. According to an exemplary embodiment, the fourth layer 5 can be embedded in the fifth layer 6.

The fifth layer 6 can include a first electrically insulating layer 61, which can be made of a silicon dioxide, and a second electrically insulating layer 62, which can also made of a silicon dioxide. The first and second electrically insulating layers 61, 62 can be made of the same material, although they can be made of different insulating materials. The second electrically insulating layer 62 covers the first electrically insulating layer 61. For an RC-IGBT with a fourth layer 5 formed as a planar gate electrode as shown in FIG. 2, for example, the first electrically insulating layer 61 is arranged on top of the first main side 21. The fourth layer 5, which forms a gate electrode, is embedded between the first and second electrically insulating layers 61, 62, which form the fifth layer 6. According to an exemplary embodiment, the fourth layer 5 can be completely embedded between the first and second electrically insulating layers 61, 62. Thus, the fourth layer 5 is separated from the first, second and third layers 2, 3, 4 by the first electrically insulated layer 61. The fourth layer 5 can be made of a heavily doped polysilicon or a metal such as aluminum, for example.

The at least one third layer 4, the fourth layer 5 and the fifth layer 6 are formed in such a way that a first opening 16 is created above the second layer 3. The first opening 16 is surrounded by the at least one third layer 4, the fourth layer 5 and the fifth layer 6. The first opening 16 is formed as a contact opening.

A first electrical contact 10 is arranged on the first main side 21 within the first opening 16. This first electrical contact 10 can also cover the fifth layer 6, but is separated and thus electrically insulated from the fourth layer 5 by the second electrically insulating layer 62. The first electrical contact 10 is in direct electrical contact with the second layer 3 and the third layer 4.

Figure 11:
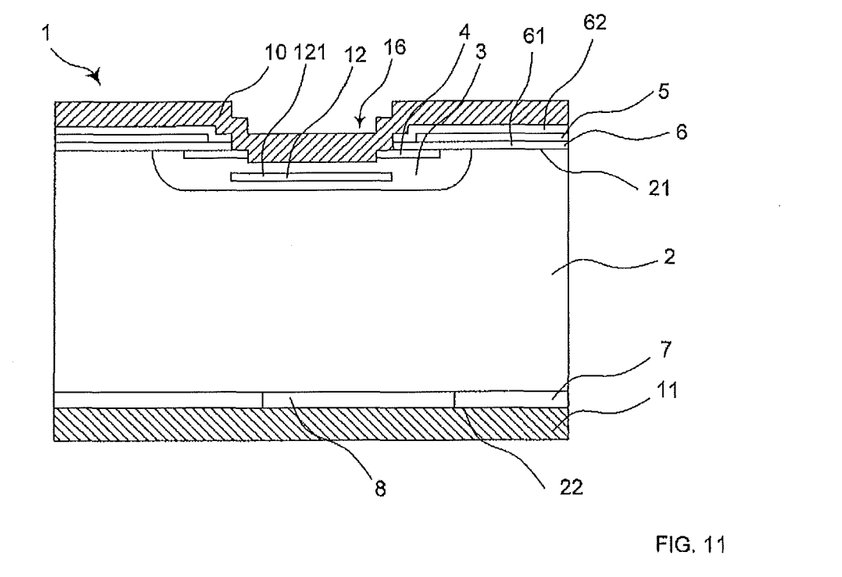
FIG. 11 shows a cross sectional view of another exemplary embodiment of a reverse-conducting IGBT according to the present disclosure.

At least one p-type sixth layer 7 and at least one n-type seventh layer 8 are arranged on the second main side 22. The at least one sixth and seventh layers 7, 8 are arranged alternately in a plane. The seventh layer 8 has a higher doping than the first layer 2. In accordance with an exemplary embodiment, the seventh layer 8 is arranged directly below the first opening 16, but the position of the seventh layer 8 could also be shifted to a side as shown in FIG. 11. It is not necessary to have the seventh layer 8 aligned to the first opening 16 and, thus, to the first electrical contact 10.

A second electrical contact 11 is arranged on the second main side 22 and is in direct electrical contact with the at least one sixth and seventh layers 7, 8.

Figure 4:
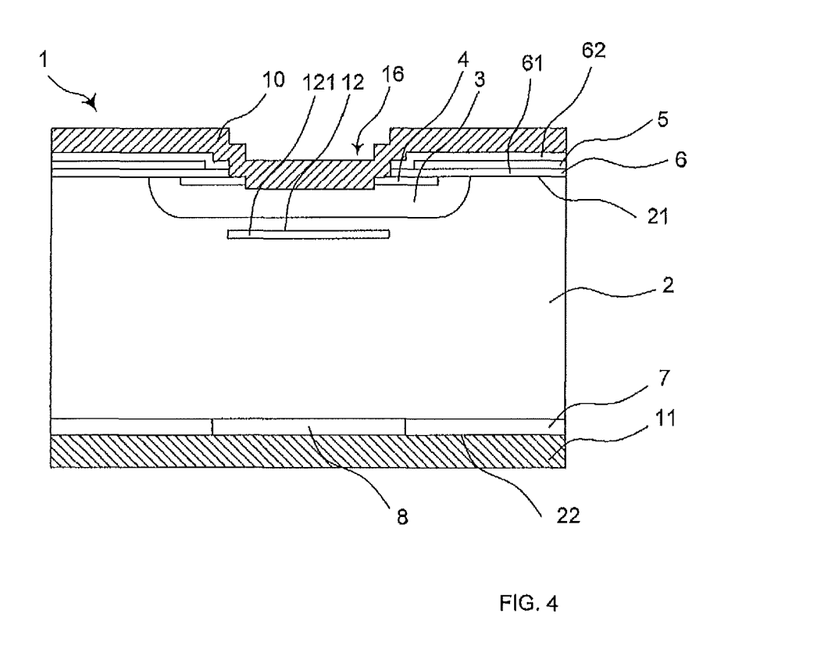
FIG. 4 shows a cross sectional view of another exemplary embodiment of a reverse-conducting IGBT according to the present disclosure.

A ninth recombination layer 12 formed as a defect layer, which includes a first defect region 121, is arranged in a self-aligned manner to the first opening 16. For example, the extension of the ninth layer 12 is limited by the border of the first contact opening 16, either within the second layer 3 or, as shown in FIG. 4, within the first layer 2 below the second layer 3. The first defect region 121 is arranged within the first layer 2 in a depth of at maximum 10 μm below the junction between the second layer 3 and the first layer 2. In the drawings, the ninth layer 12 is represented by the area of maximum recombination centers concentration within the ninth layer 12. The depth of the ninth layer 12 is to be understood as the depth of the maximum recombination centers concentration.

In another exemplary embodiment, the ninth defect layer 12 is arranged in a self-aligned manner to the first opening 16. For example, the position of the ninth layer 12 is limited to an area below the first contact opening 16, within the second layer 3 and within the first layer 2 below the second layer 3. In this example, the ninth layer 12 extends from a region within the second layer 3 to a region within the first layer 2.

Figure 12:
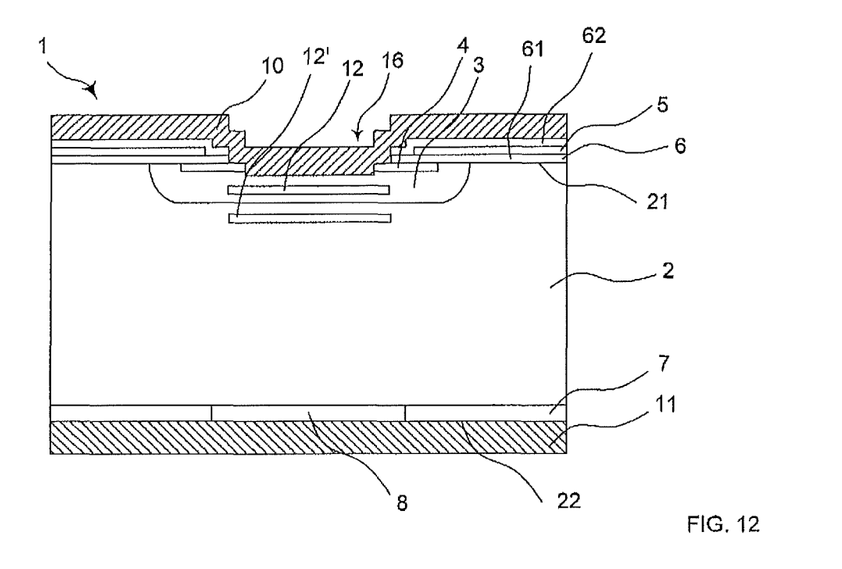
FIG. 12 shows a cross sectional view of another exemplary embodiment of a reverse-conducting IGBT according to the present disclosure.

As shown in FIG. 12, the exemplary RC-IGBT can also include more than one ninth layer, e.g. two ninth layers. One of these ninth layers 12 could be arranged within the second layer 3 and a further ninth layer 12' within the first layer 2.

Figure 13:
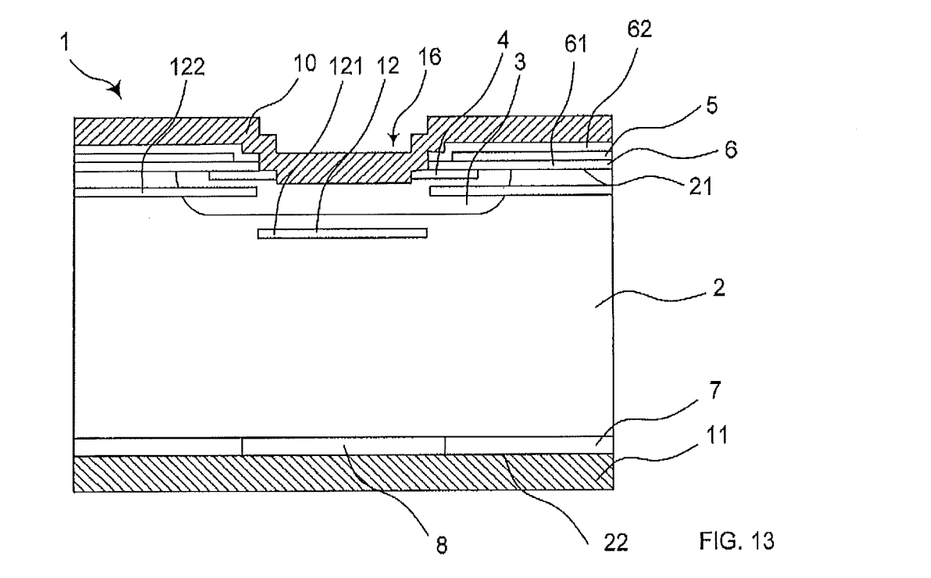
FIG. 13 shows a cross sectional view of another exemplary embodiment of a reverse-conducting IGBT according to the present disclosure.

In another exemplary embodiment, as shown in FIG. 13, the at least one ninth layer 12, 12' includes a first defect region 121, which is arranged below the first opening 16, and at least one second defect region 122, which is arranged below the fourth and fifth layers 5, 6, i.e. below the first mask 14. The first defect region 121 is arranged in a greater depth than the second defect region 122, and the second defect region 122 is arranged at maximum in a depth corresponding to the thickness of the second layer 3, for example, at maximum in a depth of 1 μm.

Figure 10:
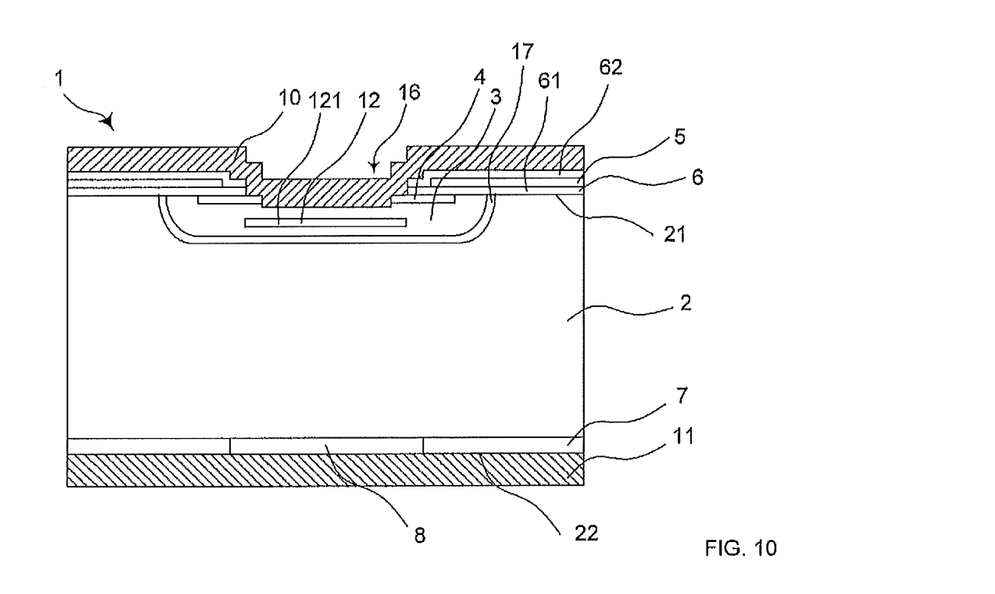
FIG. 10 shows a cross sectional view of another exemplary embodiment of a reverse-conducting IGBT according to the present disclosure with an enhancement layer.

In another exemplary embodiment shown in FIG. 10, a tenth n doped layer 17, formed as an enhancement layer, is arranged between the second layer 3 and the first layer 2 for having lower on-state losses. The tenth layer 17 separates the second layer 3 from the first layer 2 and it has higher doping than the first layer 2.

Figure 9:
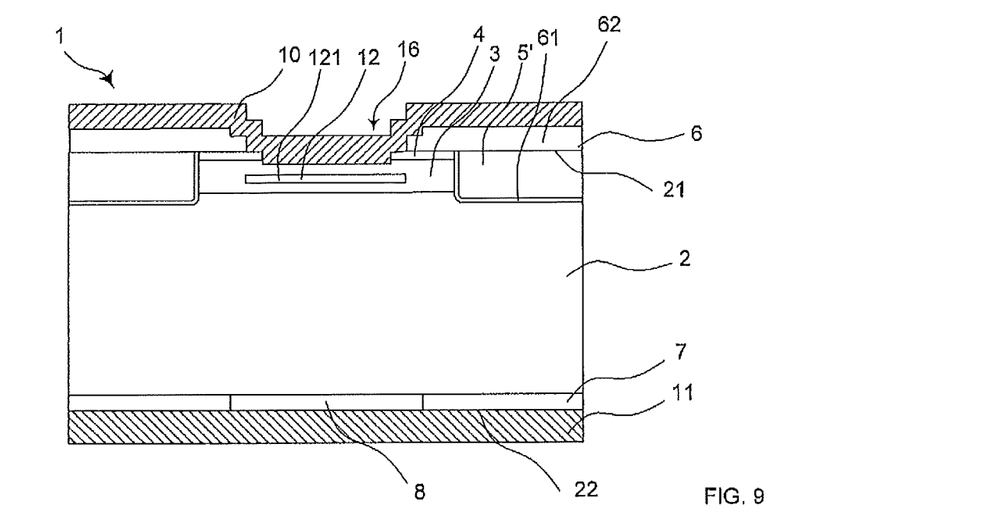
FIG. 9 shows a cross sectional view of another exemplary embodiment of a reverse-conducting IGBT according to the present disclosure with trench gate electrodes.

As an alternative to the exemplary RC-IGBT with a planar gate electrode, FIG. 9 illustrates an exemplary RC-IGBT which includes a fourth layer 5' that is formed as trench gate electrode. The trench gate electrode 5' is arranged in the same plane as the second layer 3 and adjacent to the second layer 3, separated from each other by a first insulating layer 61, which also separates the fourth layer 5' from the first layer 2. A second insulating layer 62 is arranged on top of the fourth layer formed as a trench gate electrode 5', thus insulating the fourth layer 5' from the first electrical contact 10.

In an accordance with exemplary embodiments of an RC-IGBT having a trench gate design 5', an active cell 180 is formed between two trench gate electrodes 5', between which trench gate electrodes the second and third layers 3, 4 are electrically connected to the first electrical contact 10. In the area between two active cells 180, there may be pitched cells 181 or dummy cells 182 arranged.

Figure 14:
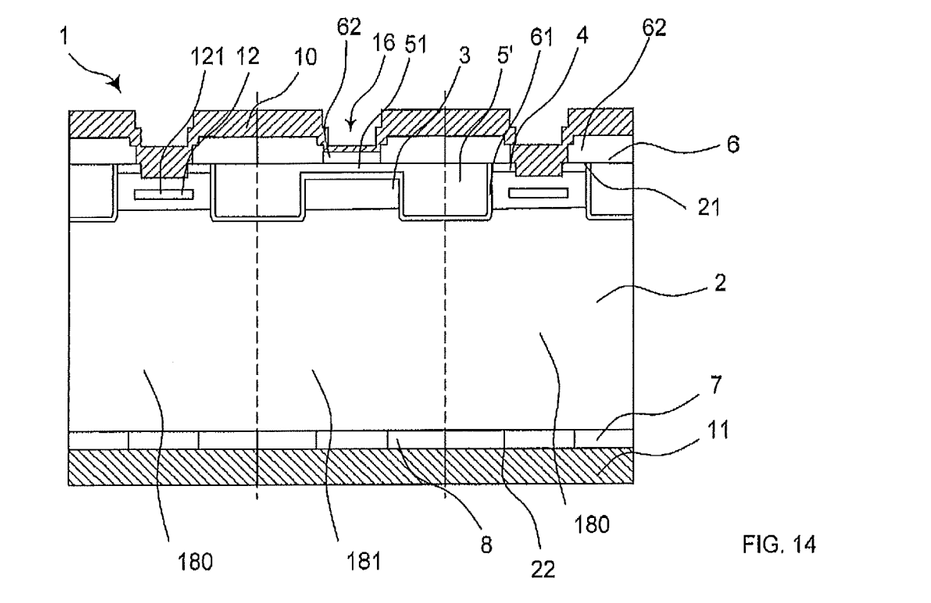
FIG. 14 shows a cross sectional view of another exemplary embodiment of a reverse-conducting IGBT according to the present disclosure with trench gate electrodes in active and pitched cells.

An exemplary RC-IGBT with active and pitched cells 180, 181 is shown in FIG. 14. The cells 180, 181 are shown in FIG. 14 as being separated by the dashed lines. A pitched cell 181 is a cell in which there is an electrically conductive connection layer 51 between two trench gate electrodes 5' of two neighbored active cells. The connection layer 51 is arranged only at the surface area on the first main side 21. Below the connection layer 51, a p-doped second layer 3 is arranged. The p-doped second layer 3 is separated from the connection layer 51 by the first insulating layer 61 of the fifth layer 6. However, there is no third layer 4 arranged in the pitched cell and there is no electrical connection layer 51 between the second layer 3 to the first electrical contact 10. They are separated by the second insulating layer 61 of the fifth layer 6.

Figure 15:
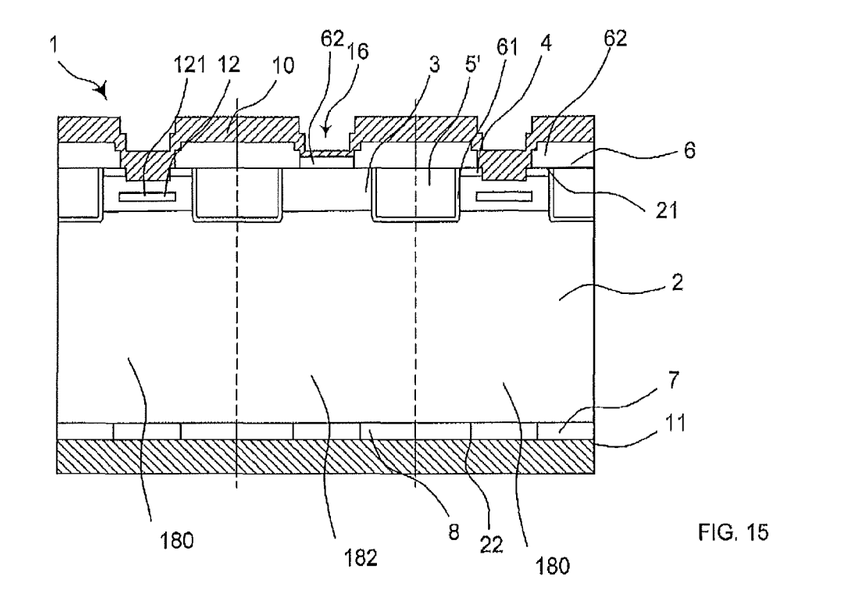
FIG. 15 shows a cross sectional view of another exemplary embodiment of a reverse-conducting IGBT according to the present disclosure with trench gate electrodes in active and dummy cells.

In an exemplary trench gate design 5' with dummy trench cells 182 as shown in FIG. 15, the cells are constructed similar to the active cells 180, i.e. second and third layers 3, 4 are present, but the second and third layers 3, 4 are insulated from the first electrical contact 10 by the second insulating layer 62 of the fifth layer 6.

Figure 16:
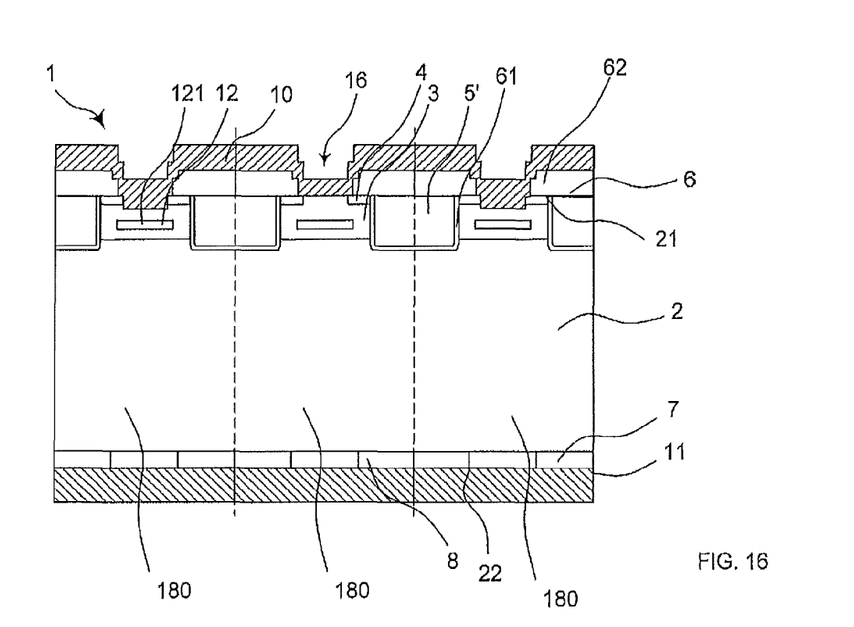
FIG. 16 shows a cross sectional view of another exemplary embodiment of a reverse-conducting IGBT according to the present disclosure with trench gate electrodes only with active cells.
Figure 17:
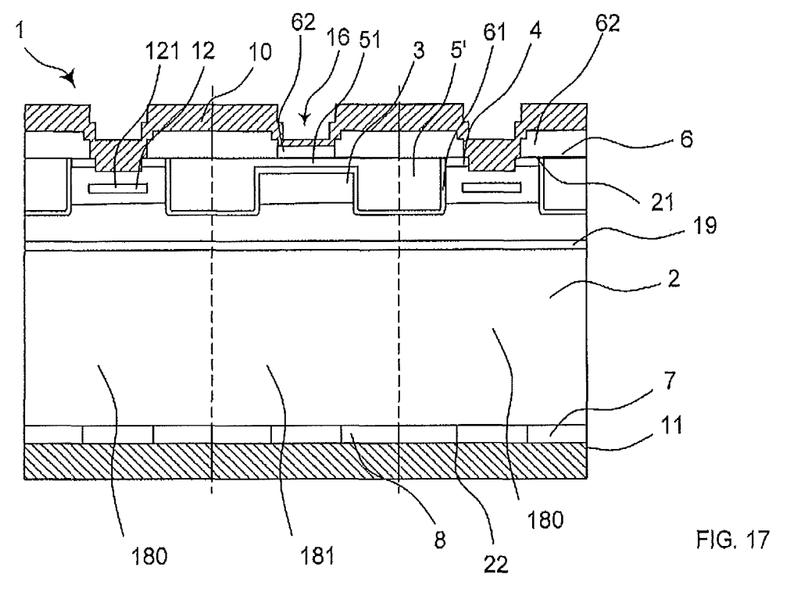
FIG. 17 shows a cross sectional view of another exemplary embodiment of a reverse-conducting IGBT according to the disclosure with trench gate electrodes in active and pitched cells and a lifetime control layer.

In another exemplary embodiment shown in FIG. 16, the RC-IGBT comprises a plurality of active cells 180, which are arranged directly neighbored to each other. The active cells 180 are shown in FIG. 16 by the dashed lines. The active cells 180 are arranged repetitively and directly next to each other without any dummy or pitched cells between the active trench cells 180. This means that each trench gate electrode limits the active cells 180, which arranged to both sides of the trench gate electrode 5'.

In such a device, defect layers 12 can be arranged in each active cell. By such an arrangement, charges between the active cells, which can hardly be influenced by the defect layer 12, are avoided. In a large part of the active area of the RC-IGBT, defect layers can be arranged without increasing the on-state losses of the IGBT. This effect can be further increased, if the trench gate 5' is made shallow and narrow, i.e. the gate electrode has a small depth measured from the first main side 21 and a small width measured parallel to the first main side 21. Also, a wide cell pitch enhances this effect, i.e. if the trench gate electrodes 5' have a greater distance from each other, thus increasing the width of the second layer 3. A wider cell pitch also lowers the saturation current.

It is possible to add an n-doped enhancement layer by diffusion or deep implantation. The n-doped enhancement layer can be arranged between the second layer 3 and the first layer 2, and have a higher doping concentration than the first layer 2.

Figure 3:
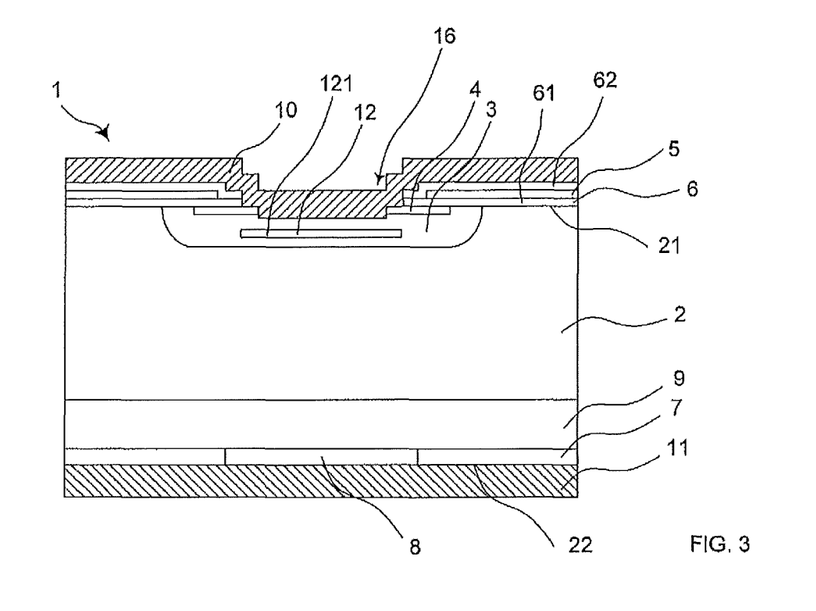
FIG. 3 shows a cross sectional view of another exemplary embodiment of a reverse-conducting IGBT according to the present disclosure.

As shown in FIG. 3, in another exemplary embodiment, the RC-IGBT 1 further includes an n-type eighth layer 9, which is arranged between the first layer 2 and the plane in which the at least one sixth and seventh layers 7, 8 are arranged. In this arrangement, the eighth layer 9 has a higher doping than the first layer 2 and a lower doping than the seventh layer 8.

In another exemplary embodiment, the conductivity types are switched, i.e. all layers of the first conductivity type are p-type (e.g. the first layer 2) and all layers of the second conductivity type are n-type (e.g. the second layer 3).

In the exemplary RC-IGBT 1, a diode is formed between the first electrical contact 10, which forms an anode electrode in the diode, the second layer 3, part of which forms an anode layer, the first layer 2, part of which forms a base layer, the seventh layer 8, which forms a cathode layer, and the second electrical contact 11, which forms a cathode electrode.

In the exemplary RC-IGBT 1, an insulating bipolar transistor (IGBT) is formed between the first electrical contact 10, which forms an emitter electrode in the IGBT, the third layer 4, which forms a source region, the second layer 3, part of which forms a channel region, the first layer 2, part of which forms a base region, the sixth layer 7, which forms a collector layer, and the second electrical contact 11, part of which forms a collector electrode.

The exemplary RC-IGBT 1 can be used in a converter, for example.

Figure 5:
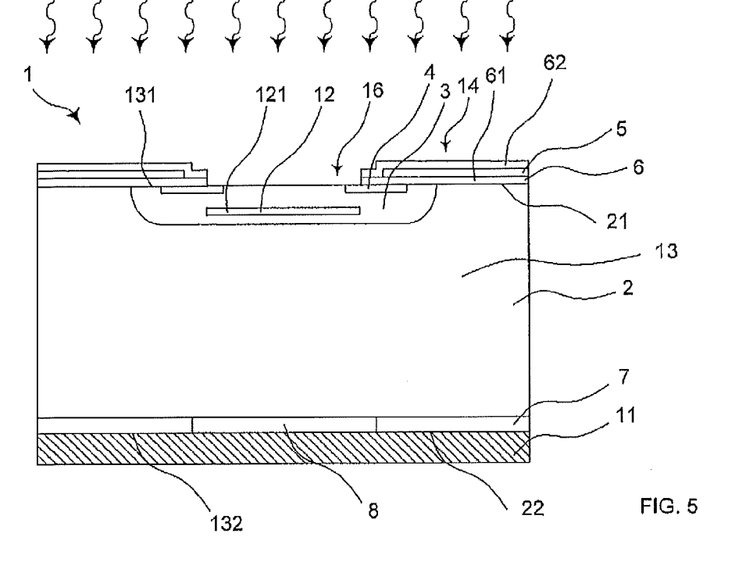
FIG. 5 shows an exemplary manufacturing step in a method of a manufacturing a reverse-conducting IGBT according to the present disclosure.

Exemplary embodiments of the present disclosure also provide a method for manufacturing a reverse-conducting insulated gate bipolar transistor 1. In the exemplary method, the following steps may be performed:

As illustrated in FIG. 5, for example, an n-type wafer 13 has a first side 131 and a second side 132 opposite the first side 131. A part of the wafer 13 which has an unamended doping in the finalized reverse-conducting insulated gate bipolar transistor (RC-IGBT) forms a first layer 2. A p-type second layer 3 is created on the first side 131. The part of the wafer 13 which has an unamended doping in the finalized RC-IGBT may hereinafter be referred to as "the part of the second layer 3."

At least one n-type third layer 4, which is surrounded by the second layer 3, is created on the first side 131. The third layer 4 has a higher doping than the first layer 2.

Afterwards, a first electrically insulating layer 61 is created on the first side 131. The first electrically insulating layer 61 partially covers the at least one third layer 4, the second layer 3 and the first layer 2. For example, the third layer 4 can be completely covered on the first side 131, the second layer 3 is covered on the first side 131 on the part of the second layer 3, which lies in between the third layer 4 and the first layer 2, and the first layer 2 is also completely covered on that part, which lies on the first side 131.

An electrically conductive fourth layer 5 is created on the first side 131 and arranged on the first electrically insulating layer 61. The fourth layer 5 may be made of a heavily doped polysilicon or a metal such as aluminum, for example.

A second electrically insulating layer 62 can be formed on the electrically conductive fourth layer 5 in such a way that the fourth layer 5 is arranged between the first and second electrically insulating layers 61, 62. The fourth layer 5 can be completely embedded. The second electrically insulating layer 62 can be made of a low-temperature silicon dioxide material as described above. The first and second electrically insulating layers 61, 62 form a fifth layer 6.

The at least one third layer 4, the fourth layer 5 and the fifth layer 6 are created in such a way that they form a first opening 16 above the second layer 3.

A first electrical contact 10 is created on the first side 131. The first electrical contact 10 is in direct electrical contact with the second layer 3 and the third layer 4. The first electrical contact 10 can cover the fifth layer 6, for example.

At least one p-type sixth layer 7 and at least one n-type seventh layer 8, which has a higher doping than the first layer 2, are created on the second side 132 of the wafer 13. The at least one sixth and seventh layers 7, 8 are arranged alternately in a plane.

A second electrical contact 11 is created on the second side 132 on the at least one sixth and seventh layers 7, 8 on the side opposite the first layer 2. The second electrical contact 11 is in direct electrical contact with the at least one sixth and seventh layers 7, 8.

After the creation of the fourth and fifth layers 5, 6, a ninth layer 12 is created as a defect layer by implantation of ions on the first side 131 through the first opening 16. In FIGS. 5 to 8, the implantation is represented by s-shaped arrows. At least the fourth and fifth layers 5, 6 can be used as a first mask 14.

Due to the introduction of the first mask 14, the ions can penetrate within the first opening 16 into the wafer to a greater depth than below the first mask 14. Below the first mask 14, the ions penetrate into the wafer 13 at a maximum depth to the thickness of the second layer 3. In particular, the ions penetrate into the wafer 13 at maximum to a depth of 1 μm, for example. In this case, as shown in FIG. 13, the ninth layer 12 includes a first defect region 121, which is aligned to the first opening 16, i.e. the extension of the ninth layer 12 is limited by the border of the first contact opening 16, and below the first opening 16, the ninth layer 12 includes a second defect region 122 is formed below the first mask 14. As the second defect regions 122 are located close to the first main side 21, this device can achieve the advantage of improved diode characteristics without deteriorating the IGBT characteristics.

Alternatively, the ions may be prevented from penetrating into the wafer 13 in the area around the first opening 16 by the first mask 14 so that the ninth layer 12 is merely formed in the wafer below the first opening 16. In this case, the ninth layer 12 only includes the first defect region 121 arranged below the first opening 16.

Figure 6:
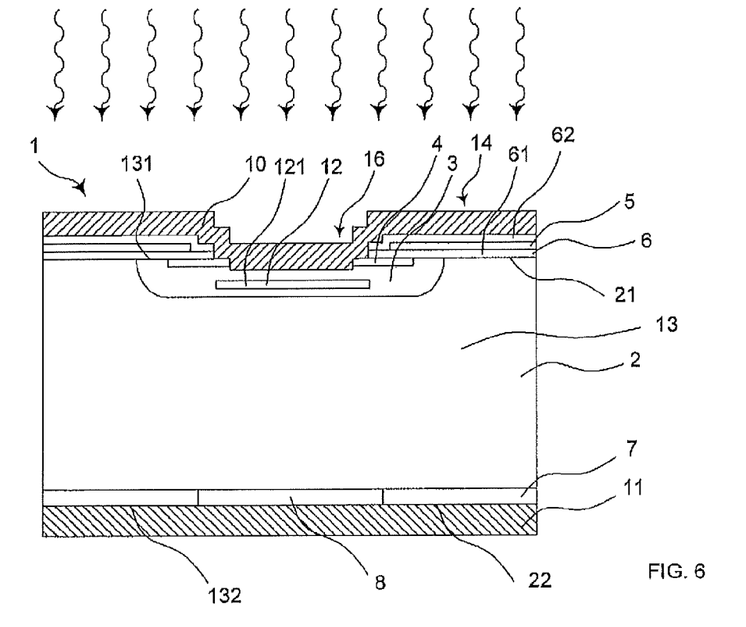
FIG. 6 shows an exemplary manufacturing step in another method of manufacturing a reverse-conducting IGBT according to the present disclosure.

In a exemplary embodiment, the ions for creating the ninth defect layer 12 are implanted before the creation of the first electrical contact 10, as shown in FIG. 5. Alternatively, the ions for creating the ninth layer 12 are implanted after the creation of the first electrical contact 10, as shown in FIG. 6. In that case, the first mask 14 further includes the first electrical contact 10.

Figure 7:
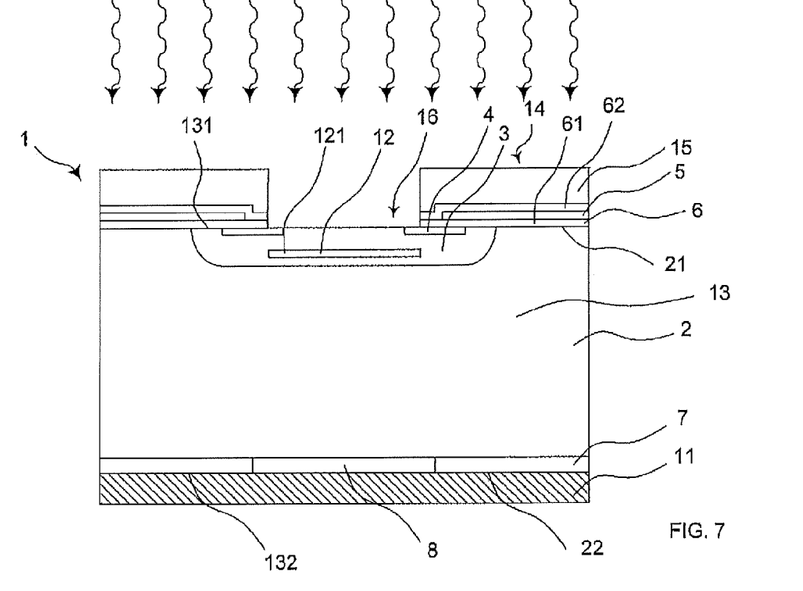
FIG. 7 shows an exemplary manufacturing step in another method of manufacturing a reverse-conducting IGBT according to the present disclosure.

As shown in FIG. 7, in another exemplary embodiment, a second mask 15 is created before the creation of the first electrical contact 10 on top of the fifth layer 6, which has a second opening above the second layer 3, where the second opening can correspond to the first opening 16, for example. The first mask 14 further includes the second mask 15. The second mask 15 can be a resist mask, for example, which is removed before finalizing the RC-IGBT. By the introduction of the second mask 15, the thickness of the first mask 14 is enhanced and thus the absorption of ions in the mask is improved. Also, higher energies can be used for the ion implantation, which is advantageous, if it is desired to create the ninth layer 12 in a greater depth in the wafer 13.

Figure 8:
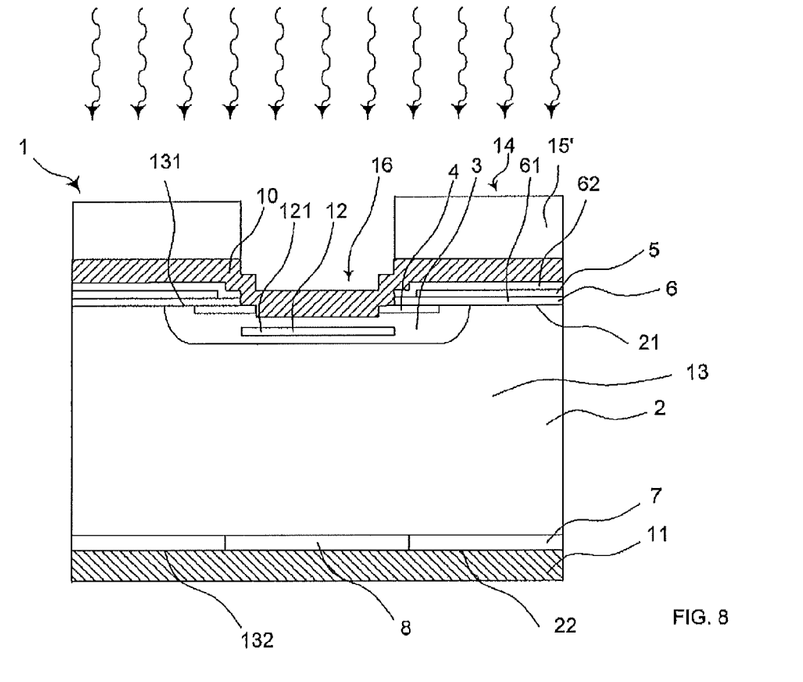
FIG. 8 shows an exemplary manufacturing step in another method of manufacturing a reverse-conducting IGBT according to the present disclosure.

Alternatively, FIG. 8 shows a second mask 15', which is created after the creation of the first electrical contact 10 on top of the first electrical contact 10. This second mask 15' also has a second opening above the second layer 3. The second opening can correspond to the first opening 16, but the second opening could also be wider, smaller or shifted as compared to the first opening 16. The first mask 14 further includes the second mask 15'. The second mask 15' can be a resist mask, for example, which is removed before finalizing the RC-IGBT.

Alternatively, the second mask 15' can be a metal mask, for example, which can either be removed before finalizing the semiconductor device or which is retained in the finalized device. Also, such a metal second mask 15' may be introduced before or after the creation of the first electrical contact 10.

Hydrogen or Helium ions may be used, for example, as ions for implantation.

In another exemplary embodiment, the ions for implantation can be phosphorous or boron ions, for example. The phosphorous or boron ions may be multiple charged ions, such as double charged boron ($B^{++}$) or triple charged phosphorous ($P^{+++}$), for example. The dose of the ions for implantation can be higher than $1*10^{11}/cm^2$, for example. According to an exemplary embodiment, after the implantation of the ions, an anneal step is performed, such as at a temperature of not more than 500° C. (e.g., at a temperature between 150° C. and 450° C., to ensure that no doping effects take place in the p-type second layer 3 (or in the first layer 2 below the second layer 3), i.e. only crystal defects are created in the defect layer, which do not create a doping, and local lifetime is conserved.

The ninth layer 12 can be created within the second layer 3 or within the first layer 2 below the second layer 3. In another exemplary embodiment, the ninth layer 12 can be arranged within the second and first layer 2, 3, i.e. within an area, which extends from the second layer 3 to the first layer 2.

According to an exemplary embodiment, the RC-IGBT can include two or more ninth defect layers 12, 12'. In this case, one of these ninth layers 12 could be created by implantation of hydrogen or Helium ions and a further ninth defect layer 12' could be created by implantation of phosphorous or boron ions, for example. Additionally, the implantation steps could be performed at different stages of the device manufacturing, e.g. one implantation step before creation of the first electrical contact 10 and a further step after creation of the contact 10 or one implantation before and the other after introduction of a second mask 15, 15' so that a lot of possibilities arise for optimizing the location and properties of the defect layers 12, 12'.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCE LIST

1 RC-IGBT
2 first layer
21 first main side
22 second main side
3 second layer
4 third layer
5 fourth layer
51 connection layer
6 fifth layer
61 first electrically insulating layer
62 second electrically insulating layer
7 sixth layer
8 seventh layer
9 eighth layer
10 first electrical contact
11 second electrical contact
12, 12' ninth layer
121 first defect region
122 second defect region
13 wafer
131 first side
132 second side
14 first mask
15, 15' second mask
16 first opening
17 tenth layer
180 active cell
181 pitched cell
182 dummy cell

What is claimed is:

1. A reverse-conducting insulated gate bipolar transistor comprising:
    a first layer of a first conductivity type with a first main side and a second main side opposite the first main side;
    a second layer of a second conductivity type arranged on the first main side;
    at least one third layer of the first conductivity type arranged on the first main side and surrounded by the second layer;
    a first electrically insulating layer arranged on the first main side and partially covering the at least one third layer;
    an electrically conductive fourth layer arranged on the first main side and being electrically insulated from the at least one third layer, the second layer and the first layer by the first electrically insulating layer;
    a second electrically insulating layer covering the first insulating layer, wherein the first and second electrically insulating layers form a fifth layer, the electrically conductive fourth layer being arranged between the first and second electrically insulating layers such that the fourth layer is embedded in the fifth layer, the at least one third layer, the fourth layer and the fifth layer being formed in such a way that a first opening is surrounded by the at least one third layer, the fourth layer, and the fifth layer and arranged above the second layer;
    a first electrical contact arranged on the first main side in direct electrical contact with the second layer and the third layer within the first opening;
    at least one sixth layer of the second conductivity type and at least one seventh layer of the first conductivity type, which are arranged on the second main side, the at least one sixth and seventh layers being arranged alternately in a plane;
    a second electrical contact arranged on the second main side in direct electrical contact with the at least one sixth layer and the at least one seventh layer; and
    at least one ninth layer constituting a defect layer with defect centers, the defect centers not contributing to doping, wherein the ninth layer is arranged self-aligned to the first opening, so that a lateral extension of the at least one ninth layer being limited to an area defined by a border of the first opening within at least one of the second layer and the first layer below the second layer.

2. The reverse-conducting insulated gate bipolar transistor according to claim 1, wherein the at least one ninth layer is arranged within the first layer at a maximum depth of 10 μm below a junction between the second layer and the first layer.

3. The reverse-conducting insulated gate bipolar transistor according to claim 1, comprising an eighth layer of the first conductivity type arranged between the first layer and the plane in which the at least one sixth and seventh layers are arranged.

4. The reverse-conducting insulated gate bipolar transistor according to claim 1, wherein the at least one ninth layer comprises-a first defect region, which is arranged below the first opening, and at least one second defect region, which is arranged below the fourth and fifth layer, and
> wherein the first defect region is arranged at a greater depth than the second defect region, and the second defect region is arranged at maximum depth of 1 μm corresponding to the thickness of the second layer.

5. The reverse-conducting insulated gate bipolar transistor according to claim 2, comprising a tenth layer of the first conductivity type arranged between the second layer and the first layer,
> wherein the tenth layer separates the second layer and the first layer.

6. The reverse-conducting insulated gate bipolar transistor according to clam 2, comprising a fourth layer formed as a trench gate electrode, which is arranged in the same plane and adjacent to the second layer, the trench gate electrode being electrically insulated from the second layer and first layer by the fifth layer.

7. The reverse-conducting insulated gate bipolar transistor according to claim 4, comprising an active cell formed between two trench gate electrodes,
> wherein the second and third layers are electrically connected to the first electrical contact between which trench gate electrodes, and
>
> wherein the transistor comprises a plurality of said active cells which are arranged directly neighbored to each other.

8. A converter with a reverse-conducting insulated gate bipolar transistor according to claim 2.

9. The reverse-conducting insulated gate bipolar transistor according to claim 2, comprising an eighth layer of the first conductivity type arranged between the first layer and the plane in which the at least one sixth and seventh layers are arranged.

10. The reverse-conducting insulated gate bipolar transistor according to claim 2, wherein the at least one ninth layer comprises a first defect region, which is arranged below the first opening, and at least one second defect region, which is arranged below the fourth and fifth layer, and
> wherein the first defect region is arranged at a greater depth than the second defect region, and the second defect region is arranged at maximum depth of 1 μm corresponding to the thickness of the second layer.

11. A converter with a reverse-conducting insulated gate bipolar transistor according to claim 3.

12. A converter with a reverse-conducting insulated gate bipolar transistor according to claim 4.

* * * * *

UNITED STATES PATENT AND TRADEMARK OFFICE
CERTIFICATE OF CORRECTION

PATENT NO. : 8,450,777 B2
APPLICATION NO. : 12/778751
DATED : May 28, 2013
INVENTOR(S) : Rahimo et al.

It is certified that error appears in the above-identified patent and that said Letters Patent is hereby corrected as shown below:

Title Page, Item (75) Inventors should read

-- (75) Inventors: Munaf Rahimo, Uezwil (CH); Jan Vobecky, Lenzburg (CH); Arnost Kopta, Zurich (CH); Marco Bellini, Schlieren (CH) --.

Signed and Sealed this
Seventh Day of June, 2016

Michelle K. Lee
*Director of the United States Patent and Trademark Office*